United States Patent [19]

Sitzler

[11] Patent Number: 4,923,414

[45] Date of Patent: May 8, 1990

[54] COMPLIANT SECTION FOR CIRCUIT BOARD CONTACT ELEMENTS

[75] Inventor: Fred C. Sitzler, Dillsburg, Pa.

[73] Assignee: E. I. du Pont de Nemours and Company, Wilmington, Del.

[21] Appl. No.: 374,711

[22] Filed: Jul. 3, 1989

[51] Int. Cl.⁵ .......................................... H01R 13/428
[52] U.S. Cl. ...................................... 439/751; 439/82
[58] Field of Search ................ 439/82, 751, 825–827, 439/873

[56] References Cited

U.S. PATENT DOCUMENTS

| | | | |
|---|---|---|---|
| 3,492,627 | 1/1970 | Tauscher | 439/82 |
| 3,588,789 | 6/1971 | Kailus | 439/825 |
| 3,820,061 | 6/1974 | Holden | 439/82 |
| 4,206,964 | 6/1980 | Olsson | 339/221 |
| 4,274,699 | 6/1981 | Keim | 339/176 |
| 4,655,537 | 4/1987 | Andrews | 339/221 |
| 4,728,164 | 3/1988 | Lemmens et al. | 439/870 |
| 4,793,817 | 12/1988 | Hiesbock | 439/82 |

FOREIGN PATENT DOCUMENTS 319837 10/1929 United Kingdom ............... 439/825

Primary Examiner—Gary F. Paumen
Attorney, Agent, or Firm—John E. Griffiths

[57] ABSTRACT

The present invention relates to compliant sections utilized on contact elements which are mounted in plated-through holes in printed circuit boards, generally in conjunction with a plastic header and other electrical connectors. More particularly, the invention disclosed comprises a compliant section which includes a first deformable member and a second deformable member defining a substantially tear drop shaped space therebetween such that when the compliant section is press fit into an appropriately sized hole the members flex together forming a tapered shape.

24 Claims, 3 Drawing Sheets

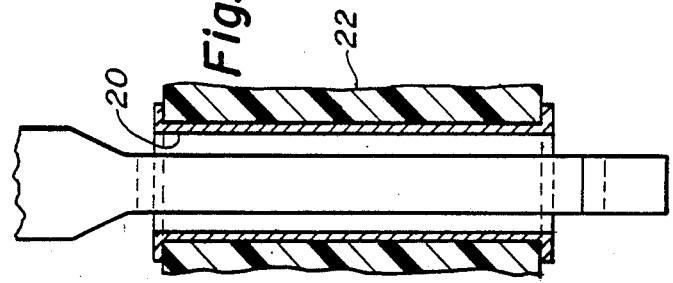
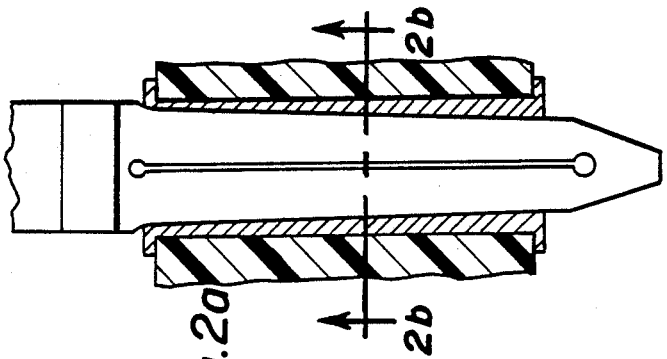
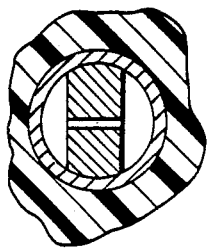
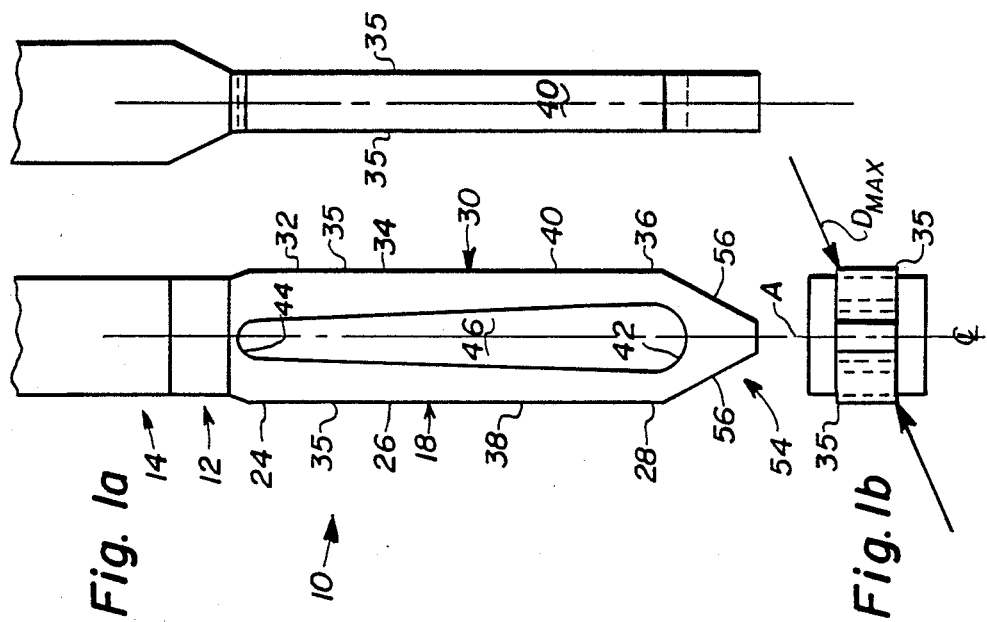

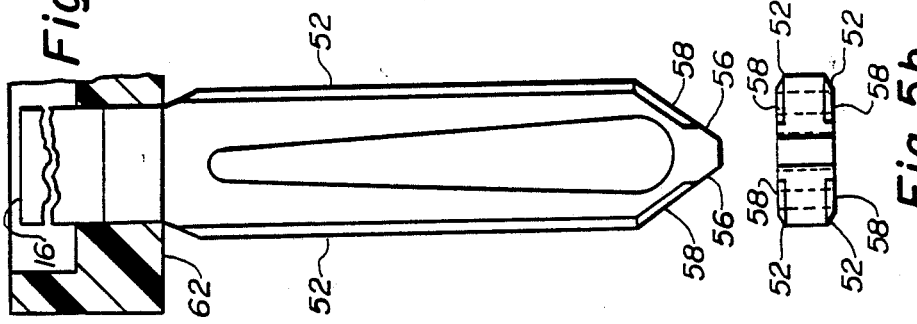
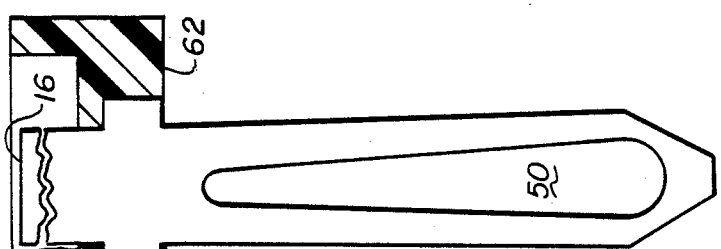
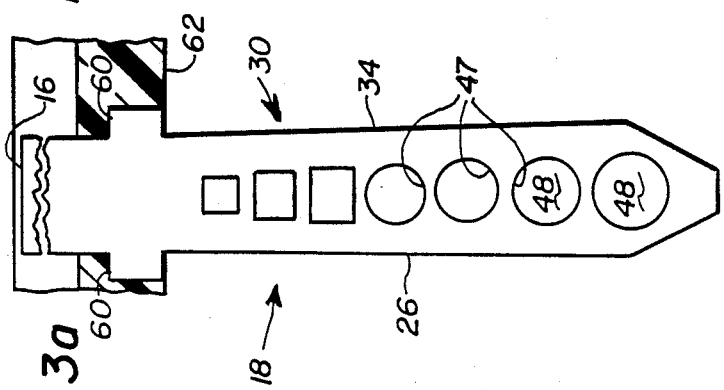

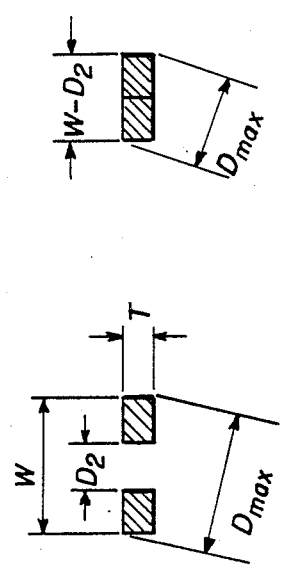
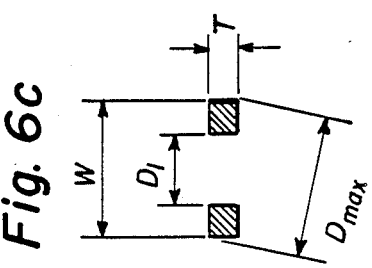
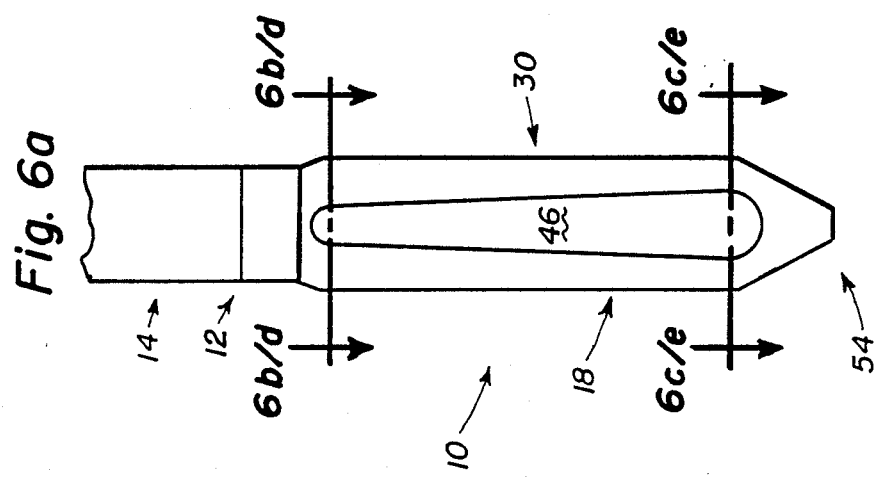

COMPLIANT SECTION FOR CIRCUIT BOARD CONTACT ELEMENTS

BACKGROUND OF THE INVENTION

1. Field of the Invention

This invention relates to compliant sections utilized on contact elements which are for mounting in plated-through holes in printed circuit boards, generally in conjunction with a header and other electrical connectors.

2. Description of Related Art

Electrical contacts, terminals or pins are used in the electronics industry in conjunction with printed circuit (PC) boards and panel boards for making electrical connections between, and among, circuits. The contacts have one end for making electrical contact with a conductive path on the PC board. The contacts have another end for electrical connection elsewhere. Many of the contacts have a compliant, contact or press fit end or section for forcing into a plated hole through the board deforming the compliant section. This results in an interference fit which is relied upon to hold the contact in the board and to provide an electrical connection between the contact and the material plating the hole. Such connections are solderless. It is also common to use multi-contact electrical connectors for connection to a printed circuit board or the like where each of the contacts has a compliant section.

In the past, the centers of holes in a circuit board were spaced about 0.1 inches (or about 2.540 mm) apart. The standard hole size in a printed circuit board was about 0.040 inches (or about 1 mm) in diameter with a manufacturing tolerance of plus or minus about 0.002 inches (or about 0.051 mm). A standard contact used for this size hole has a compliant section with a maximum dimension transverse to the insertion direction of 0.046 inches (or 1.18 mm). The compliant section deforms when forced into the hole. In order to be used for holes throughout the tolerance range, the contact only needs to be capable of deforming from about 10% up to about 21% of its maximum transverse thickness, i.e., its distance from one of its corners to its far corner. U.S. Pats. No. 4,655,537, 4,206,964 and 4,728,164 disclose contacts for mounting in traditional size holes having a diameter of 0.040 inches (or 1 mm) or greater.

To increase the number of electrical connections per unit area on a circuit board, boards have recently been produced with holes spaced about 0.050 inches (or about 1.27 mm) apart from center to center. If the hole size remained the same for such a board, the space on the board for providing conductive paths and insulative portions would be insufficient for most applications. As such, smaller hole sizes are desired or planned having diameters of about 0.024 inches (or about 0.6 mm) plus or minus about 0.004 inches (or about 0.1 mm) to provide more space for the conductive paths and insulative portions. Of course, whatever hole diameter is specified, manufacturers will still only be able to produce such holes with a tolance of plus or minus about 0.002 inches (or about 0.051 mm). Furthermore, boards are being proposed much thinner than before. As a result, new smaller contacts are needed for connection to the smaller holes and thinner PC boards.

However, making the contacts smaller makes them more flexible and more likely to bend or distort. Furthermore, manufacturers of the boards still require a tolerance of plus or minus about 0.002 inches (or 0.051 mm) in making the holes. As a result, the contacts must now be capable of deforming at least 30% of its maximum transverse thickness. In other words, contacts must now be capable of press fitting and, thus, being retained by an interference fit in holes varying more in diameter in comparison to the size of the contact than previously existing contacts.

In view of these facts, it is desirable to provide a contact having a compliant section for insertion and conforming to holes having a large tolerance in relation to the hole size and, in particular, to small holes having a large tolerance.

SUMMARY OF THE INVENTION

The present invention relates to a compliant section of an electrical contact element for mechanical and electrical connection with a plated-through hole in a printed circuit board comprising:
  means for enabling the compliant section to deform to a tapered shape while being press fit into the hole without significantly damaging the plated-through hole such that the compliant section can be removed from and then repress fitted back in the hole.

The present invention can be further described as being directed to a compliant section of an electrical contact element for mechanical and electrical connection with a plated-through hole in a printed circuit board comprising:
  a first deformable member having a first end, a central portion and a second end, the first member having a cross section which decreases in area from the first member first end to the first member second end;
  a second deformable member having a first end, a central portion and a second end, the second member having a cross section which decreases in area from the second member first end to the second member second end;
  the first member first end being connected to the second member first end, the first member second end being connected to the second member second end, and the first member central portion being spaced from the second member central portion at increasing distances from the first ends to the second ends; and
  whereby when the second ends of the first and second members of the compliant section are inserted into a hole which has a diameter which is less than a maximum transverse dimension of the first and second members, the members are flexed towards each other and outwardly facing surfaces of the members bear against the wall of the hole so that the contact element is retained in, without significantly damaging, the plated-through hole.

The contact element of the present invention can be made by a method of making a contact element for mechanical and electrical connection with a plated-through hole in a printed circuit board comprising:
  piercing at least one passage through a flat piece of metal; and
  trimming the metal around the at least one passage to form the contact element having a compliant section comprising:
    a first deformable member having a first end, a central portion and a second end, the first member having a cross section which decreases in area from the first member first end to the first member second end;

a second deformable member having a first end, a central portion and a second end, the second member having a cross section which decreases in area from the second member first end to the second member second end;

the first member first end being connected to the second member first end, the first member second end being connected to the second member second end, and the first member central portion being spaced from the second member central portion at increasing distances from the first ends to the second ends;

the at least one passage at least partially defining the first member and the second member; and an insertion end having tapered sides for easy initial positioning in the hole.

The present invention is further directed to a method of making a contact element for mechanical and electrical connection with a plated-through hole in a printed circuit board comprising:

pressing a space on a flat piece of metal to form a web; and trimming the metal around the web to form the contact element having a compliant section comprising:

a first deformable member having a first end, a central portion and a second end, the first member having a cross section which decreases in area from the first member first end to the first member second end;

a second deformable member having a first end, a central portion and a second end, the second member having a cross section which decreases in area from the second member first end to the second member second end;

the first member first end being connected to the second member first end, the first member second end being connected to the second member second end, and the first member central portion being spaced from the second member central portion at increasing distances from the first ends to the second ends;

the web connected between the first member and the second member; and an insertion end having tapered sides for easy initial positioning in the hole.

BRIEF DESCRIPTION OF THE DRAWINGS

The invention can be more fully understood from the following detailed description thereof in connection with accompanying drawings which form a part of this application and in which:

FIG. 1a is a front side view of a first embodiment of a compliant section of a contact element in accordance with the present invention.

FIG. 1b is a bottom view of the compliant section illustrated in FIG. 1a.

FIG. 1c is right side view of the compliant section illustrated in FIG. 1a.

FIG. 2a, is a front side view of the compliant section of FIG. 1a in a plated-through hole of a printed circuit board.

FIG. 2b is a cross sectional view of the compliant section illustrated in FIG. 2a taken along line 2b—2b in the direction of the arrows.

FIG. 2c is right side view of the compliant section illustrated in FIG. 2a.

FIG. 3a is a front side view of a second embodiment of a compliant section of a contact element in accordance with the present invention.

FIG. 3b is a bottom view of the compliant section illustrated in FIG. 3a.

FIG. 4a is a front side view of a third embodiment of a compliant section of a contact element in accordance with the present invention.

FIG. 4b is a bottom view of the compliant section illustrated in FIG. 4a.

FIG. 5a is a front side view of a fourth embodiment of a compliant section of a contact element in accordance with the present invention.

FIG. 5b is a bottom view of the compliant section illustrated in FIG. 5a.

FIG. 6a is a front view of an embodiment of a compliant section like that shown in FIG. 1a or 4a.

FIG. 6b is a cross sectional view of the compliant section illustrated in FIG. 6a taken along line 6b/d—6b/d in the direction of the arrows.

FIG. 6c is a cross sectional view of the compliant section illustrated in FIG. 6a taken along line 6c/e—6c/e in the direction of the arrows.

FIG. 6d is a cross sectional view of the compliant section illustrated in FIG. 6a taken along line 6b/d—6b/d in the direction of the arrows after the compliant section has been press fit into a hole and collapsed.

FIG. 6e is a cross sectional view of the compliant section illustrated in FIG. 6a taken along line 6c/e—6c/e in the direction of the arrows after the compliant section has been press fit into a hole and collapsed.

DESCRIPTION OF THE PREFERRED EMBODIMENT(S)

Throughout the following detailed description, similar reference numerals refer to similar elements in all FIGS. of the drawings.

Referring to FIGS. 1a, 1b and 1c, there is illustrated a front side view, a bottom view and a right side view, respectively, of a first embodiment of a compliant or contact section 10 of a contact element for mechanical and electrical connection with a plated-through hole 20 in a printed circuit board 22 in accordance with the present invention. The hole 20 is shown in FIGS. 2a, 2b and 2c. FIGS. 2a and 2c illustrate a front side view and a right side view, respectively, of the compliant section 10 of FIGS. 1a, 1b and 1c press fit in a plated-through hole 20 in a printed circuit board 22. FIG. 2b is a cross sectional view of the compliant section illustrated in FIG. 2a taken along line 2b—2b in the direction of the arrows.

The compliant section 10 has a first deformable member 18 having a first end 24, a central portion 26 and a second end 28. The first member 18 has a cross section which decreases in area from the first member first end 24 to the first member second end 28. The compliant section 10 further has a second deformable member 30 having a first end 32, a central portion 34 and a second end 36. The second member 30 also has a cross section which decreases in area from the second member first end 32 to the second member second end 36.

The first member first end 24 is connected to the second member first end 32. The first member second end 28 is connected to the second member second end 36. The first member central portion 26 is spaced from the second member central portion 34 at increasing distances from the first ends 24, 32 to the second ends 28, 36. As such, referring to FIGS. 2a, 2b and 2c, when the first ends 24, 32 of the first and second members 18, 30 of the compliant section 10 are inserted into a hole 20 which has a diameter which is less than a maximum transverse dimension $D_{max}$ of the first and second members 18, 30, the members 18, 30 are flexed towards each other and outwardly facing surfaces 38, 40 of the members 18, 30 bear against the wall of the hole 20 so that the contact element is retained in the hole 20. Further, the compliant section 10 illustrated in FIG. 1a has four corner edges 35 adapted to contact the plated-through hole 20 when press fit in the hole 20.

Referring to the embodiment illustrated in FIG. 1a, a slot, space or passage 46 extends through the compliant section 10 between the central portions 26, 34 of the members 18, 30. Preferably, the passage has a substantially tear drop cross sectional shape in a longitudinal direction of the compliant section 10. Curved portions 42 and 44 of the tear drop may be circular with the radius of the curved portion 42 depicted lower in FIG. 1a being greater than the radius of the curved portion 44 depicted higher in FIG. 1a. As long as when the compliant section 10 is inserted into the hole 20 the compliant section 10 deforms to a tapered shape (as shown in FIG. 2a) allowing easier deformation of the members 18, 30 near their first ends 24, 32 than their second ends 28, 36 and allowing a lower initial insertion force with increasing force required during insertion, then the portions 42, 44 can also be made of other shapes, such as straight segments or non-circular curves.

In addition or alternatively to the space 46 being substantially tear drop shaped, the sum of the widths of the members 18, 30 along the maximum transverse dimension $D_{max}$ of the members 18, 30 near their first ends 24, 32 is greater than the sum of the widths of the members 18, 30 along the maximum transverse dimension of the members 18,30 near their second ends 28, 36 such that when the compliant section 10 is inserted into the hole 20 the compliant section 10 deforms to a tapered shape allowing easier deformation of the members 18, 30 near their second ends 28, 36 than their first ends 24, 32 and allowing a lower initial insertion force with increasing force required during insertion.

The aforedescribed structure comprises means for allowing or enabling (18, 30 and 46) the compliant section 10 to collapse or deform to a tapered shape while being press fit into the hole 20 without significantly damaging the plated-through hole 20 such that the compliant section 10 can be removed from and then repress fitted back in the hole 20. The allowing or enabling means includes means for facilitating (28, 42 and 36) an insertion end 54 of the compliant section 10 to collapse or deform easier than the remainder of the compliant section 10.

The first and second members 18, 30 are preferably substantially symmetric about an axis A. Preferably, the first and second members 18, 30 have substantially parallel outer surfaces 38, 40.

In another embodiment illustrated in FIGS. 5a and 5b, the substantially parallel outer surfaces 38, 40 are preferably connected to bevelled corner areas 52 adapted to contact and to distribute the insertion force more uniformly on the wall of the hole 20.

Preferably, the compliant section 10 has an insertion end 54 having tapered sides 56 for easy initial positioning in the hole 20. The tapered sides 56 are preferably connected to bevelled surfaces 58 to distribute the insertion force more uniformly on the wall of the hole 20.

The compliant section 10 of the present invention can be made any size, e.g., the length, width, thickness and taper of the members 18, 30 and the space 46 can be modified, to accommodate most, if not all, hole sizes and board thicknesses. Furthermore, the compliant section 10 of the present invention is sufficiently deformable to retain its contact element in a hole having a diameter of about 0.024 inches (or about 0.6 mm) with a hole tolerance of plus or minus 0.002 inches (or 0.051 mm). Moreover, the compliant section 10 of the present invention is capable of deforming in one cross section transverse to its insertion direction at least 30% of its maximum transverse dimension or thickness, $D_{max}$.

Another embodiment of the present invention is illustrated in FIGS. 3a and 3b. In this embodiment, the central portions 26, 34 of the first and second members 18, 30 are preferably connected by at least one bridge 47. A plurality of the bridges 47 can divide the space or passage 46 between the central portions 26, 34 of the first and second members 18, 30 into a plurality of passages or holes 48. The passages 48 have increasing cross sectional areas towards the insertion end of the compliant section 10. The passages 48 can have any shape, but preferably they have square, rectangular or circular cross sections.

Referring to FIGS. 4a and 4b, there is illustrated an embodiment of the present invention having a web shaped bridge 50 connecting the members 18, 30. The bridge 50 is less thick than the members 18, 30. The members 18, 30 and the bridge 50 may have a substantially H shaped cross section. The bridge 50 separates the space between the members 18, 30 into two tear-drop-shaped recesses.

In FIGS. 1a, 1b, 1c 2a, 2b and 2c, the compliant section 10 is connected to a transition section 12 which, in turn, connects to an insertion force receiving section or post 14. Preferably, the post 14 is a pin having a square cross section as seen in FIG. 1b. When the section 14 is a pin having a square cross section, an insertion or staking force can be applied to the end 16 of the contact spaced from the compliant section 10.

The compliant sections 10 illustrated in FIGS. 3a and 4a are connected directly to a force receiving section 14, rather than to a transitional section as shown in FIG. 1a. In FIGS. 3a and 4a, the force receiving section 14 includes shoulders 60 for receiving force for inserting the compliant section 10 into the hole 20. The shoulders 60 are provided when the contact at the end spaced from the compliant section 10 is not shaped to stand insertion force such as when the contact at the other end is a bent spring.

Contact elements or terminals having a compliant section 10 in accordance with the present invention may be individually press fit in or staked within a plated hole in a printed circuit board. Alternatively, contact elements or terminals having a compliant section 10 in accordance with the present invention may be assembled or molded to a plastic header, shroud or housing 62 and then press fit into plated holes in a printed circuit board. If ends of the contact elements or terminals are not shaped to receive insertion force, e.g., when the end is a bent spring, then the staking force can be applied through the header, shroud or housing to shoulders or other means.

FIGS. 6a through 6e are provided to illustrate the dimensions of a preferred embodiment and to illustrate the deformability of the compliant section of the present invention. FIG. 6a is a front view of an embodiment of a compliant section like that shown in FIG. 1a or 4a. FIG. 6b is a cross sectional view of the compliant section illustrated in FIG. 6a taken along line 6b/d—6b/d in the direction of the arrows. FIG. 6c is a cross sectional view of the compliant section illustrated in FIG. 6a taken along line 6c/e—6c/e in the direction of the arrows.

The uncompressed compliant section 10 can be 0.028 inches (or 0.72 mm) wide, designated W in FIGS. 6b and 6c. The curvature $D_1$ of the tear drop passage 46 or web 50 closest to the insertion end 54 of the compliant section 10 can be circular and have a diameter of 0.012 inches (or 0.31 mm). The curvature $D_2$ of the tear drop passage 46 or web 50 remote or farthest from the insertion end 54 of the compliant section 10 can be circular and have a diameter of 0.008 inches (or 0.21 mm). The thickness, T, of the compliant section can be 0.010 inches (or 0.26 mm). Under these conditions, the uncompressed compliant section's maximum transverse dimension, $D_{max}$, is 0.030 inches (or 0.77 mm) and is the same in FIGS. 6b and 6c.

FIG. 6d is a cross sectional view of the compliant section illustrated in FIG. 6a taken along line 6b/d—6b/d in the direction of the arrows after the compliant section has been press fit into a hole totally collapsing the space between its first member 18 and its second member 30. FIG. 6e is a cross sectional view of the compliant section illustrated in FIG. 6a taken along line 6c/e—6c/e in the direction of the arrows after the compliant section has been press fit into a hole totally collapsing the space between its first member 18 and its second member 30.

Assuming that the space between its first member 18 and its second member 30 is totally compressed and that the corner edges of the members 18, 30 do not deform, then the compliant section's maximum transverse dimension, $D_{max}$, has been reduced to 0.022 inches (or 0.56 mm) in FIG. 6d and to 0.019 inches (or 0.49 mm) in FIG. 6e. The compliant section's maximum transverse dimension, $D_{max}$, has reduced 9% in length from FIG. 6b to 6d and 36% in length from FIG. 6c to 6e. Taking into consideration factors, such as tolerances in making the members 18, 30, the presence of a web 50, etc., the compliant section of the present invention can be described as having a cross section that is capable of deforming in one cross section transverse to its insertion direction at least 30% of its maximum transverse dimension, $D_{max}$. This deformability enables the compliant section 10 of the present invention to be press fit into holes having desired, planned or specified diameters in the range of about 0.020 inches through 0.028 inches (or about 0.5 mm through 0.7 mm) made with a manufacturing tolerance of plus or minus about 0.002 inches (or about 0.051 mm). Note, however, that the compliant section need not, and typically does not, deform up to its maximum feasible limit in order to result in an adequate interference fit in the hole.

The compliant section 10 of the present invention can be made by first piercing at least one passage through a flat piece of metal. Alternatively, one presses or stamps a space or indentation in a flat piece of metal to form a web, preferably, having an H shaped cross section. Then one trims or cuts the metal around the at least one passage or indentation to form the contact element having a compliant section 10 as previously described in this disclosure. Before the trimming step, one can flatten a piece of metal wire having a square cross section to form the flat piece of metal. After the trimming step one can bevel edges of the compliant section 10 to form bevelled areas 52 and 58 to distribute the insertion force more uniformly on the wall of the hole 20.

The contact elements of the present invention can be made from any suitable metal used for electrical terminals, such as brass, phosphor bronze, beryllium copper and the like. The contact elements may be plated or coated with a conductive layer, such as tin, nickel, pladium, gold, silver or a suitable alloy.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A compliant section of an electrical contact element for mechanical and electrical connection with a plated-through hole in a printed circuit board comprising:

first and second deformable members joined together at respective first and second ends thereof, said second ends forming an insertion end, said members being separated by a recess or slot which extends longitudinally along the compliant section, the sum of the widths of the members along the maximum transverse dimension $D_{max}$ of the members near the first ends is greater than the sum of the widths of the members along the maximum transverse dimension $D_{max}$ of the members near the second ends, such that when the compliant section is inserted into the hole the compliant section deforms to a tapered shape allowing easier deformation of the members near the second ends than the first ends and allowing a lower initial insertion force with increasing force required during insertion.

2. The compliant section of claim 1, wherein the compliant section is capable of deforming transverse to its insertion direction at least 30% of its maximum transverse dimension.

3. The compliant section of claim 1, further comprising four corner edges adapted to contact the plated-through hole when press fit in the hole.

4. The compliant section of claim 1, further comprising four bevelled corner areas adapted to contact and to distribute the insertion force more uniformly on the wall of the hole when press fit in the hole.

5. The compliant section of claim 1, wherein the insertion end has tapered sides for easy initial positioning in the hole.

6. The compliant section of claim 5, wherein the tapered sides are connected to bevelled surfaces to distribute the insertion force more uniformly on the wall of the hole.

7. The compliant section of claim 1, wherein the compliant section is sufficiently deformable to retain the contact element in a hole having a diameter in the range of about 0.020 inches through 0.028 inches (or about 0.5 mm through 0.7 mm) made with a manufacturing tolerance of plus or minus about 0.002 inches (or about 0.051 mm).

8. The compliant section of claim 1, wherein the slot comprises a passage through the compliant section having a substantially tear drop shape.

9. The compliant section of claim 8, wherein the passage comprises a plurality of passages through the compliant section, the passages having increasing cross sectional areas towards the insertion end of the compliant section.

10. The compliant section of claim 1, wherein the recess comprises an indentation in the compliant section forming a web shaped bridge having a substantially tear drop shape.

11. A compliant section of an electrical contact element for mechanical and electrical connection with a plated-through hole in a printed circuit board comprising:
first and second deformable members joined together at respective first and second ends thereof, said second ends forming an insertion end, said members being separated by a recess or slot which extends longitudinally along the compliant section, the recess or slot being wider at said second ends and tapering towards said first ends, thus allowing said members at said second ends to deform together more than at said first ends,
thereby resulting in outer surfaces of said deformable members deforming together in a tapered shape towards said second ends as said compliant section is fully inserted into the plated-through hole, said outer surfaces engaging said hole.

12. The compliant section of claim 11, wherein the recess or slot is between central portions of the members and has a substantially tear drop shape.

13. The compliant section of claim 11, wherein the first and second members are substantially symmetric about an axis.

14. The compliant section of claim 11, wherein the sum of the widths of the members along the maximum transverse dimension $D_{max}$ of the members near their first ends is greater than the sum of the widths of the members along the maximum transverse dimension $D_{max}$ of the members near their second ends such that when the compliant section is inserted into the hole the compliant section deforms to a tapered shape allowing easier deformation of the members near their second ends than their first ends and allowing a lower initial insertion force with increasing force required during insertion.

15. The compliant section of claim 11, wherein the compliant section is sufficiently deformable to retain the contact element in a hole having a diameter in the range of about 0.020 inches through 0.028 inches (or about 0.5 mm through 0.7 mm) made with a manufacturing tolerance of plus or minus about 0.002 inches (or about 0.051 mm).

16. The compliant section of claim 11, wherein the compliant section is capable of deforming transverse to its insertion direction at least 30% of its maximum transverse dimension.

17. The compliant section of claim 11, wherein central portions of the first and second members are connected by at least one bridge.

18. The compliant section of claim 17, wherein the slot between the central portions of the first and second members comprises a set of progressively smaller passages with the at least one bridge partially defining the passages.

19. The compliant section of claim 18, wherein the passages have square, rectangular or circular cross sections.

20. The compliant section of claim 17, wherein there is one web shaped said bridge connecting the members such that the members and the bridge have a substantially H shaped cross section.

21. The compliant section of claim 11, wherein the first and second members have substantially parallel outer surfaces.

22. The compliant section of claim 21, wherein the substantially parallel outer surfaces are connected to bevelled corner areas to distribute the insertion force more uniformly on the wall of the hole.

23. The compliant section of claim 11, wherein the insertion end has tapered sides for easy initial positioning in the hole.

24. The compliant section of claim 23, wherein the tapered sides are connected to bevelled surfaces to distribute the insertion force more uniformly on the wall of the hole.

* * * * *